US012765404B2

(12) United States Patent

Kim et al.

(10) Patent No.: US 12,765,404 B2

(45) Date of Patent: Oct. 13, 2026

(54) SEMICONDUCTOR DEVICE AND METHOD OF FORMING CONDUCTIVE VIAS TO HAVE ENHANCED CONTACT TO SHIELDING LAYER

(71) Applicant: STATS ChipPAC Pte. Ltd., Singapore (SG)

(72) Inventors: SungSoo Kim, Seoul (KR); DaeHyeok Ha, Incheon-si (KR); SangMi Park, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 259 days.

(21) Appl. No.: 18/304,090

(22) Filed: Apr. 20, 2023

(65) Prior Publication Data

US 2023/0275013 A1 Aug. 31, 2023

Related U.S. Application Data

(63) Continuation of application No. 15/955,014, filed on Apr. 17, 2018, now abandoned.

(51) Int. Cl.

| | |
|---|---|
| ***H10W 70/63*** | (2026.01) |
| ***H05K 1/02*** | (2006.01) |
| ***H10W 42/20*** | (2026.01) |
| ***H10W 72/20*** | (2026.01) |
| ***H10W 74/00*** | (2026.01) |

(52) U.S. Cl.

CPC ........ *H10W 70/635* (2026.01); *H05K 1/0216* (2013.01); *H10W 42/20* (2026.01); *H10W 72/20* (2026.01); *H10W 74/00* (2026.01)

(58) Field of Classification Search

CPC . H01L 23/49805; H01L 23/60; H01L 23/552; H01L 23/556

See application file for complete search history.

(56) References Cited

U.S. PATENT DOCUMENTS

| | | | |
|---|---|---|---|
| 5,488,765 | A | 2/1996 | Kubota et al. |
| 5,635,670 | A | 6/1997 | Kubota et al. |
| 8,592,958 | B2 | 11/2013 | Ko et al. |
| 9,536,841 | B2 | 1/2017 | Wu |

(Continued)

FOREIGN PATENT DOCUMENTS

| | | | |
|---|---|---|---|
| KR | 20170110941 | A | 10/2017 |
| TW | 201523831 | A | 6/2015 |

*Primary Examiner* — Jesse Y Miyoshi

(74) *Attorney, Agent, or Firm* — Robert D. Atkins; PATENT LAW GROUP: Atkins and Associates, P.C.

(57) ABSTRACT

A semiconductor device has a substrate with a plurality of conductive vias formed through the substrate in an offset pattern. An electrical component is disposed in a die attach area over a first surface of the substrate. The conductive vias are formed around the die attach area of the substrate. A first conductive layer is formed over the first surface of the substrate, and a second conductive layer is formed over the second surface. An encapsulant is deposited over the substrate and electrical component. The substrate is singulated through the conductive vias. A first conductive via has a greater exposed surface area than a second conductive via. A shielding layer is formed over the electrical component and in contact with a side surface of the conductive vias. The shielding layer may extend over a second surface of substrate opposite the first surface of the substrate.

31 Claims, 14 Drawing Sheets

(56) References Cited

U.S. PATENT DOCUMENTS

| | | | |
|---|---|---|---|
| 2010/0078771 | A1 | 4/2010 | Barth et al. |
| 2012/0015687 | A1 | 1/2012 | Yamada et al. |
| 2012/0098109 | A1 | 4/2012 | Ko et al. |
| 2012/0228749 | A1 | 9/2012 | Pagaila |
| 2012/0241922 | A1 | 9/2012 | Pagaila |
| 2013/0134565 | A1 | 5/2013 | Chen et al. |
| 2014/0262475 | A1 | 9/2014 | Liu et al. |
| 2015/0170980 | A1* | 6/2015 | Kosaka .................. H01L 24/97 257/48 |
| 2016/0276290 | A1* | 9/2016 | Yamada ................ H01L 23/544 |
| 2016/0300799 | A1 | 10/2016 | Han et al. |
| 2017/0025361 | A1 | 1/2017 | Lee et al. |

* cited by examiner

SEMICONDUCTOR DEVICE AND METHOD OF FORMING CONDUCTIVE VIAS TO HAVE ENHANCED CONTACT TO SHIELDING LAYER

CLAIMS TO DOMESTIC PRIORITY

The present application is a continuation of U.S. patent application Ser. No. 15/955,014, now abandoned, filed Apr. 17, 2018, which application is incorporated herein by reference.

FIELD OF THE INVENTION

The present invention relates in general to semiconductor devices and, more particularly, to a semiconductor device and method of forming conductive vias to have enhanced contact with a shielding layer.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications such as radio frequency (RF) wireless communications, often contain one or more integrated passive devices (IPDs) to perform necessary electrical functions. The IPDs are susceptible to electromagnetic interference (EMI), radio frequency interference (RFI), harmonic distortion, or other inter-device interference, such as capacitive, inductive, or conductive coupling, also known as cross-talk, which can interfere with their operation. The high-speed switching of digital circuits also generate interference.

A semiconductor die and/or discrete IPD can be integrated into a semiconductor package. The semiconductor die and discrete IPDs are mounted to a substrate panel for structural support and electrical interconnect. An encapsulant is deposited over the semiconductor die, discrete IPDs, and substrate panel. A shielding layer is formed over the encapsulant to isolate EMI/RFI sensitive circuits. Conductive vias can be formed through the substrate panel for electrical interconnect, including the ground connection to the shielding layer. The conductive vias are cylindrical and laid out in a linear arrangement, i.e., lined up with a center point of each via along a straight line.

The substrate panel is singulated through the conductive vias so that the shielding layer can make contact with an exposed side surface of the singulated conductive vias. Singulation has some variance in the cutting alignment, direction, and angle. If the conductive vias are singulated off-center, then the cylinders are not cut into ideal half cylinders, but rather have a fraction (less than half) of the cylinder as the exposed side surface of the singulated conductive vias. The less than half fractional cylinder has a reduced vertical surface area (compared to a half cylinder from an ideal cut) of the conducive vias to make contact to the shielding layer. The reduced contact surface area can adversely affect the function of the shielding layer with a poor ground contact and less adhesive integrity to the conductive vias.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
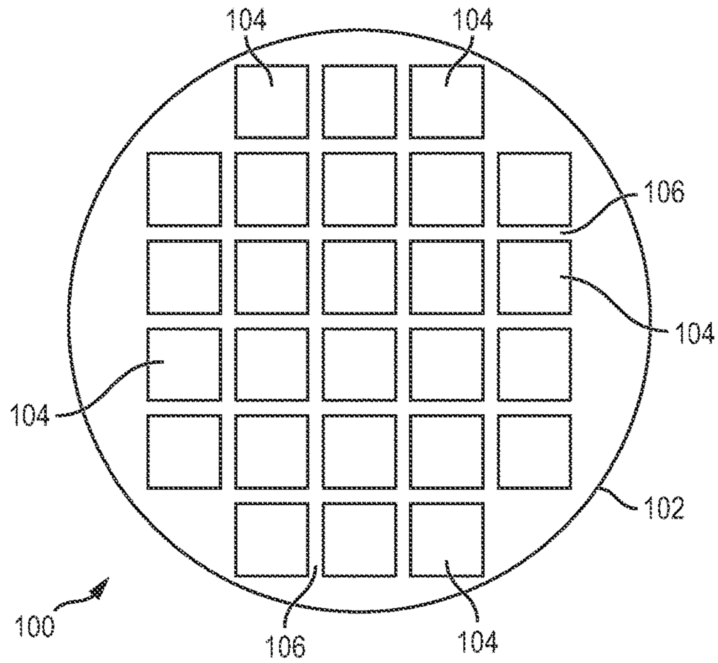
FIGS. 1*a*-1*c* illustrate a semiconductor wafer with a plurality of semiconductor die separated by a saw street.

FIG. 1*a* shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
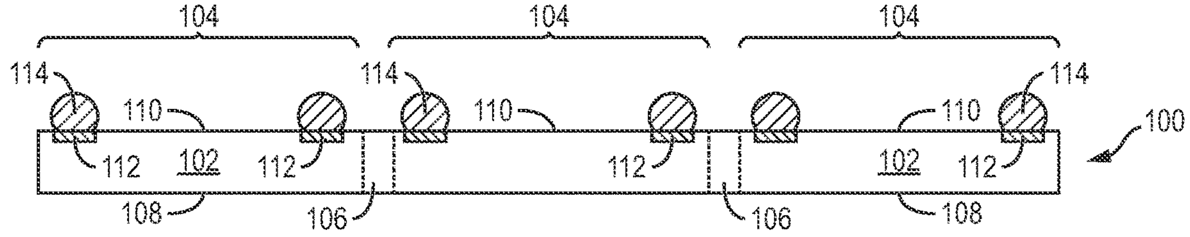

FIG. 1*b* shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
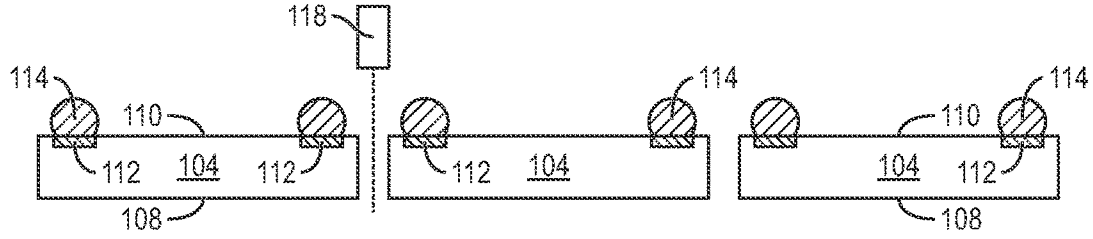

In FIG. 1*c*, semiconductor wafer 100 is singulated through saw street 106 using a saw blade or laser cutting tool 118 into individual semiconductor die 104. The individual semiconductor die 104 can be inspected and electrically tested for identification of known good die (KGD) post singulation.

Figure 2A:
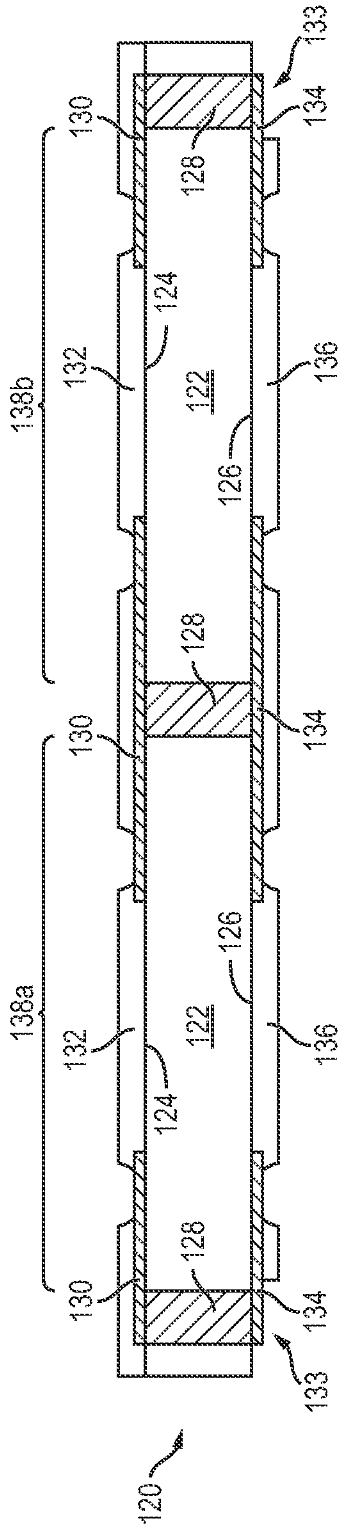
FIGS. 2*a*-2*b* illustrate a prefabricated interconnect substrate panel.
Figure 2B:
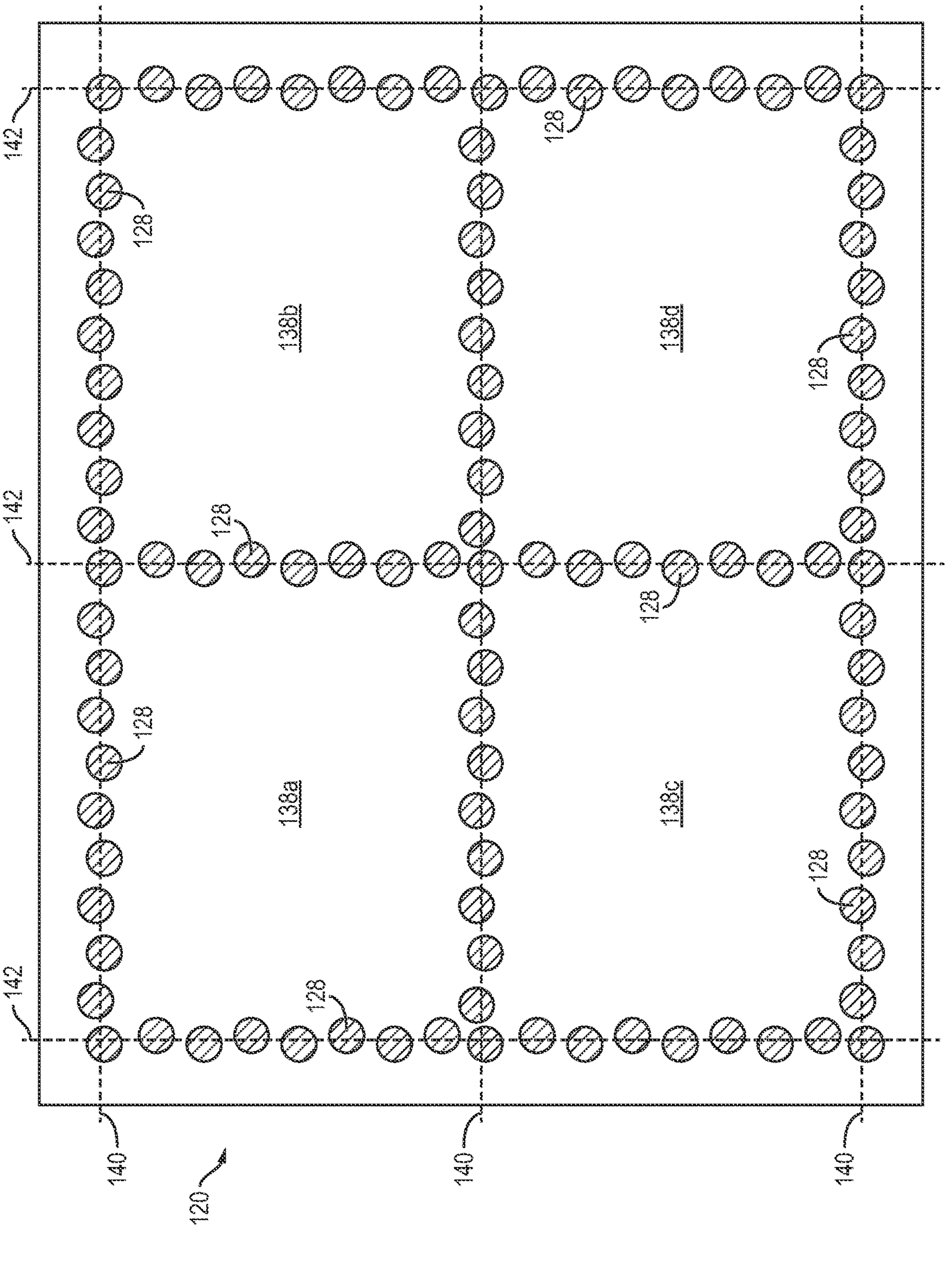

FIGS. 2*a*-2*b* illustrate a prefabricated interconnect substrate or interposer panel 120 including core substrate 122 having opposing surfaces 124 and 126. Core substrate 122 includes one or more insulating layers, such as silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Alternatively, core substrate 122 may include one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics.

A plurality of through vias is formed through core substrate 122 using laser drilling, mechanical drilling, deep reactive ion etching (DRIE), or other suitable process. The through vias extend completely through core substrate 122 from surface 124 to surface 126. The through vias are filled with Al, Cu, Sn, Ni, Au, Ag, Ti, TiW, W, or other suitable electrically conductive material or combination thereof using PVD, CVD, electrolytic plating, electroless plating process, or other suitable metal deposition process to form z-direction vertical interconnect structures or conductive vias 128.

A conductive layer 130 is formed over surface 124 of core substrate 122 using PVD, CVD, electrolytic plating, electroless plating process, or other suitable metal deposition. Conductive layer 130 includes one or more layers of Al, Cu, Sn, Ni, Au, Ag, Ti, TiW, W, or other suitable electrically conductive material or combination thereof. Portions of conductive layer 130 operate as contact pads and are electrically connected to conductive vias 128. Conductive layer 130 also includes portions that are electrically common or electrically isolated depending on the routing design and function of the semiconductor package. In one embodiment, conductive layer 130 operates as an RDL extending electrical connection from conductive vias 128 to areas adjacent to conductive vias 128 to laterally redistribute electrical signals across substrate panel 120.

An insulating or passivation layer 132 is formed over surface 124 of core substrate 122 and conductive layer 130 using PVD, CVD, printing, lamination, spin coating, spray coating, sintering, or thermal oxidation. The insulating layer 132 contains one or more layers of SiO2, Si3N4, SiON, Ta2O5, Al2O3, polymer dielectric resist with or without fillers or fibers, or other material having similar insulating and structural properties. In one embodiment, insulating layer 132 is a solder resist layer. A portion of insulating layer 132 is removed by LDA, etching, or other suitable process to expose portions of conductive layer 130.

A conductive layer 134 is formed over surface 126 of core substrate 122 using PVD, CVD, electrolytic plating, electroless plating process, or other suitable metal deposition. Conductive layer 134 includes one or more layers of Al, Cu, Sn, Ni, Au, Ag, Ti, TiW, W, or other suitable electrically conductive material or combination thereof. Portions of conductive layer 134 operate as contact pads and are electrically connected to conductive vias 128. Conductive layer 134 also may include portions that are electrically common or electrically isolated depending on the routing design and function of the semiconductor package. Alternatively, conductive vias 128 are formed through core substrate 122 after forming conductive layers 130 and 134.

An insulating or passivation layer 136 is formed over surface 126 of core substrate 122 and conductive layer 134 using PVD, CVD, printing, lamination, spin coating, spray coating, sintering, or thermal oxidation. The insulating layer 136 contains one or more layers of $SiO_2$, $Si_3N_4$, SiON, $Ta_2O_5$, $Al_2O_3$, polymer dielectric resist with or without fillers or fibers, or other material having similar insulating and structural properties. In one embodiment, insulating layer 136 is a solder resist layer. Portions of conductive layer 134 can be arranged in a repeating side-by-side rectangular pattern with an opening through insulating layer 136 to expose the conductive layer as a ground contact. A portion of insulating layer 136 is removed by LDA, etching, or other suitable process to expose portions of conductive layer 134, as well as areas 133 proximate to the connection between conductive layer 134 and conductive vias 128. Areas 133 with no insulating layer 136 extend around a perimeter of substrate panel 120 to provide external ground connection.

FIG. 2*b* is a plane view of substrate panel 120 with sufficient surface area to contain multiple semiconductor die 104. Each die attach areas 138*a*-138*d* is designated for placement of at least one semiconductor die 104. Conductive vias 128 are arranged in a staggered or offset pattern completely around a perimeter of each die attachment area 138*a*-138*d*. Substrate panel 120 will be singulated through dicing lines 140 and 142. The staggered or offset pattern of conductive vias 128 provides enhanced contact surface area along the vertical side surface post singulation, given variance during cutting along dicing lines 140 and 142.

Figure 3A:
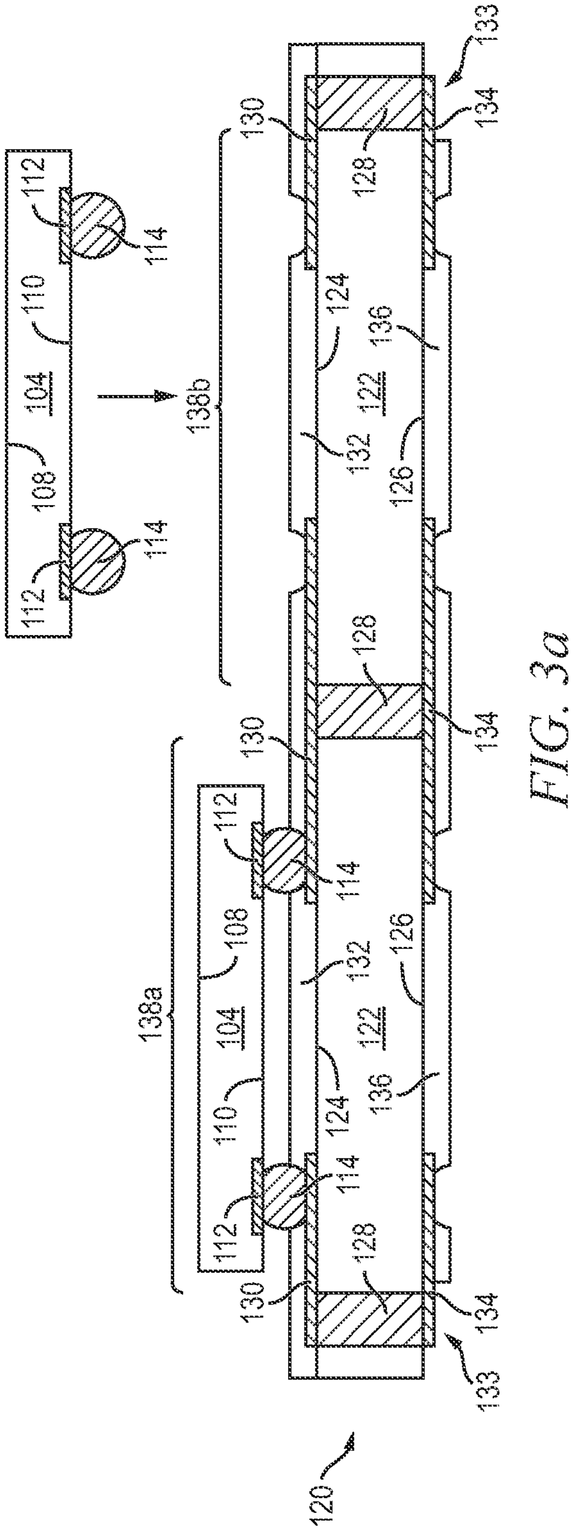
FIGS. 3*a*-3*e* illustrate a process of forming a semiconductor package using the substrate panel with staggered conductive vias.
Figure 3B:
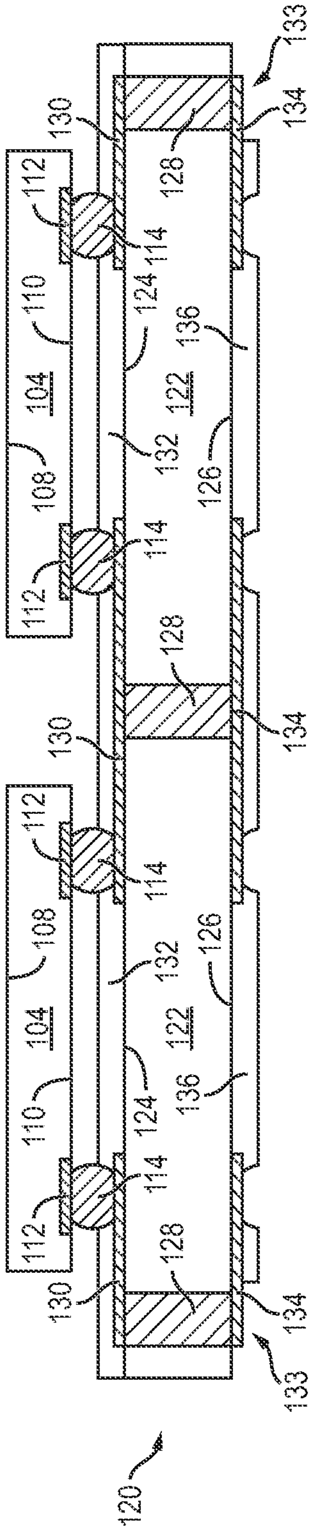
Figure 3C:
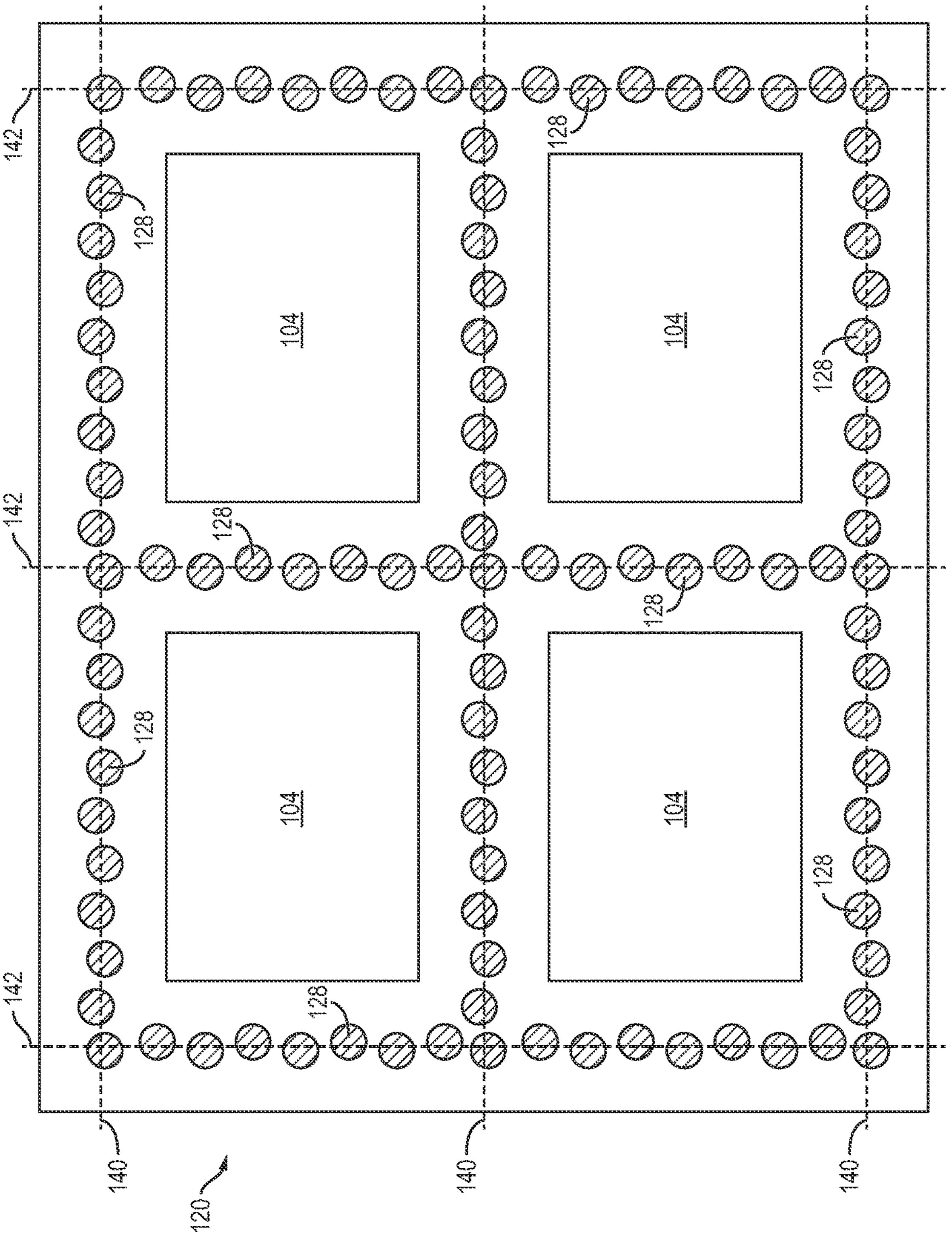

FIGS. 3*a*-3*e* illustrate a process of forming a semiconductor package using substrate panel 120 with staggered conductive vias 128. In FIG. 3*a*, semiconductor die 104 from FIG. 1*c* is positioned over each die attach area 138*a*-138*d* of substrate panel 120 using a pick and place operation with active surface 110 and bumps 114 oriented toward surface 124. FIG. 3*b* shows semiconductor die 104 bonded to conductive layer 130 within die attach areas 138*a*-138*d* of substrate panel 120 by reflowing bumps 114. FIG. 3*c* shows a plan view of semiconductor die 104 bonded to substrate panel 120 with conductive vias 128 disposed around a perimeter of each semiconductor die. Semiconductor die 104 represents one type of semiconductor device or electrical component that can be disposed over die attach areas 138*a*-138*d* of substrate panel 120. Other semiconductor or electrical components include a semiconductor package, semiconductor module, and discrete electrical device, such as a resistor, capacitor, and inductor.

Figure 3D:
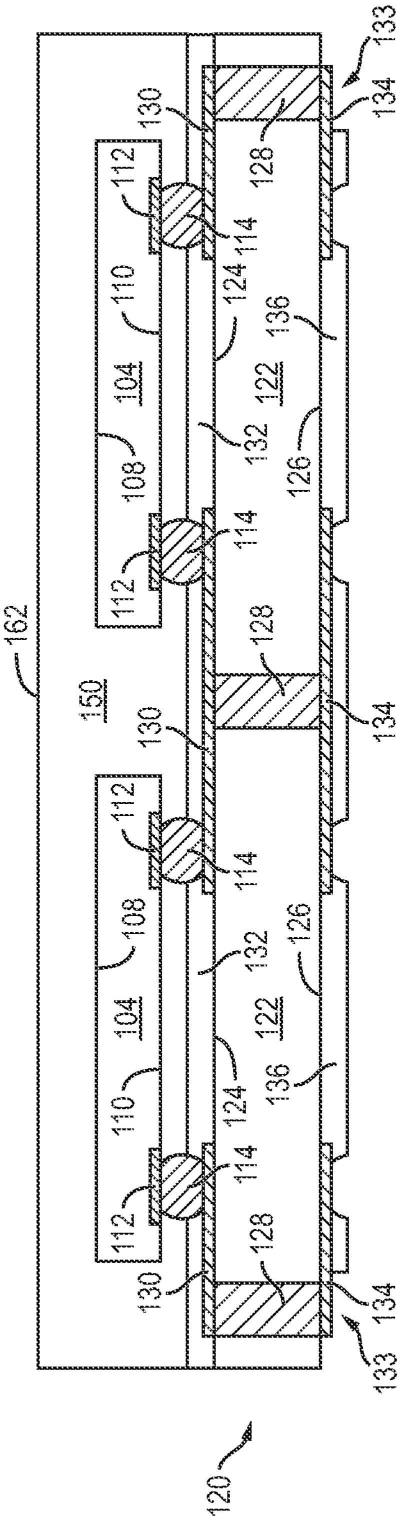

In FIG. 3*d*, an encapsulant or molding compound 150 is deposited over semiconductor die 104 and substrate panel 120 using a paste printing, compressive molding, transfer molding, liquid encapsulant molding, vacuum lamination, spin coating, or other suitable applicator. Encapsulant 150 can be polymer composite material, such as epoxy resin with filler, epoxy acrylate with filler, or polymer with proper filler. Encapsulant 150 is non-conductive, provides structural support, and environmentally protects the semiconductor device from external elements and contaminants.

Figure 3E:
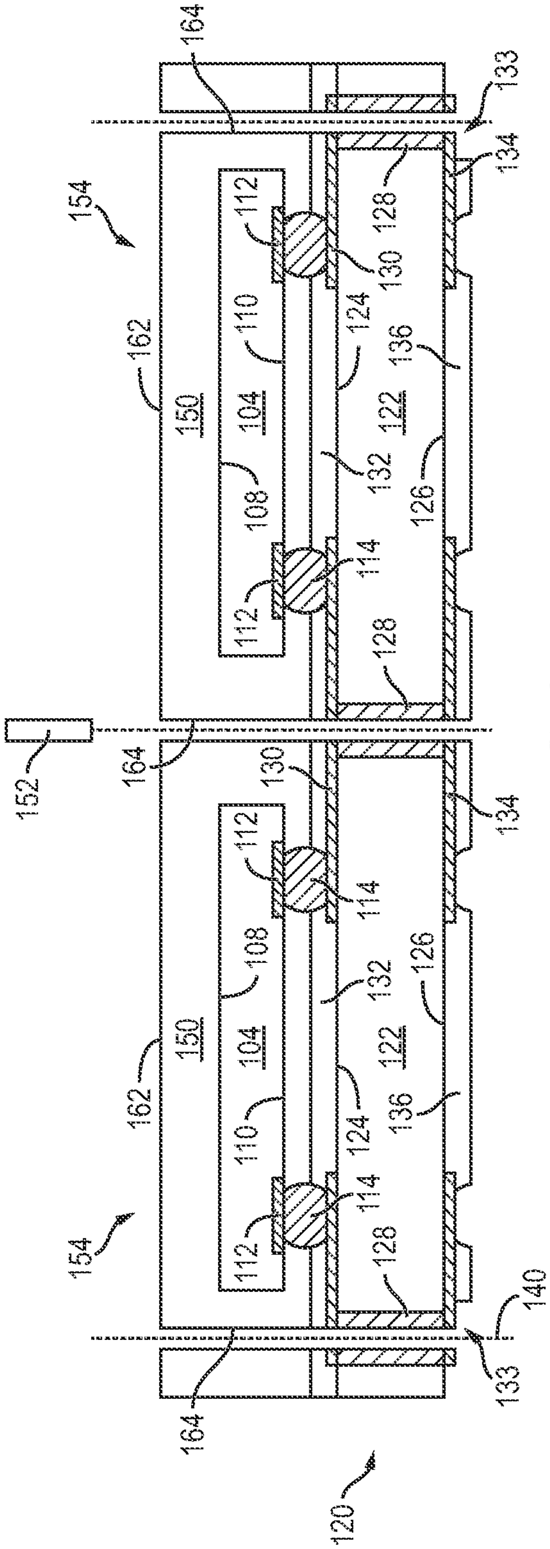

In FIG. 3*e*, semiconductor panel 120 is singulated through conductive vias 128 along dicing lines 140 and 142, see FIG. 2*b*, using a saw blade or laser cutting tool 152 into individual semiconductor packages 154. The singulation process has variance and tolerances of the cutting path. The staggered or offset pattern of conductive vias 128 provides enhanced contact surface area along vertical side surface 156 post singulation, given variance during cutting along dicing lines 140 and 142.

Figure 4A:
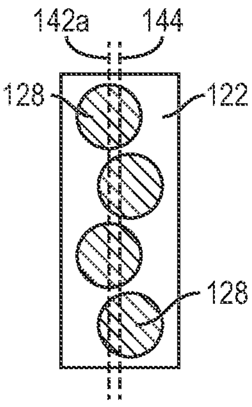
FIGS. 4*a*-4*e* illustrate singulation of the staggered conductive vias with cutting variance.
Figure 4B:
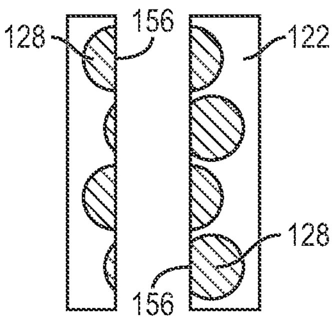
Figure 4C:
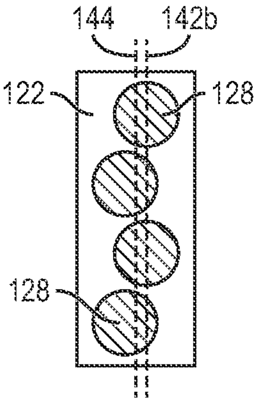
Figure 4D:
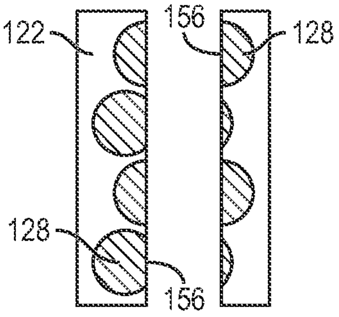
Figure 4E:
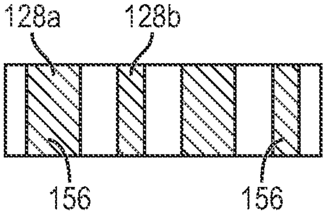

FIGS. 4*a*-4*e* illustrate further detail of singulation through conductive vias 128 arranged in the staggered or offset pattern around die attachment areas 138*a*-138*d*. In FIG. 4*a*, dicing line 142*a* is to the left of an ideal centerline 144 through conductive vias 128, due to the cutting variance. FIG. 4*b* shows the post singulation along dicing line 142*a*. In FIG. 4*c*, dicing line 142*b* is to the right of an ideal centerline 144 through conductive vias 128, again due to the cutting variance. FIG. 4*d* shows the post singulation along dicing line 142*b*. The same feature is achieved along dicing lines 140. In each case, the staggered or offset pattern of conductive vias 128 provides enhanced contact surface area along vertical side surface 156 post singulation, given variance during cutting along dicing lines 140 and 142. FIG. 4*e* shows a side view of core substrate 122 and conductive vias 128 with vertical contact side surface 156 post singulation.

The staggered or offset pattern of conductive vias 128 provides enhanced contact surface area along vertical side surface 156 to shielding layer 160, given variance during cutting along dicing lines 140 and 142. In fact, the total contact area between vertical side surfaces 156 and shielding layer 160 remains substantially uniform and constant, independent of singulation location within a tolerance of centerline 144. The enhanced contact surface area along vertical side surface 156 improves adhesion between conductive vias 128 and shielding layer 160, as well as effectiveness of electrical properties of the shielding layer. With the cylindrical form-factor and offset or staggered pattern, conductive via 128*a* has a greater exposed side surface area 156 than the adjacent conductive via 128*b*. Some conductive vias 128 have more exposed side surface area, some conductive vias 128 have less exposed side surface area. The total exposed side surface area 156 among multiple conductive vias 128 remains unchanged, independent of the dicing location within a tolerance of centerline 144.

Figure 5A:
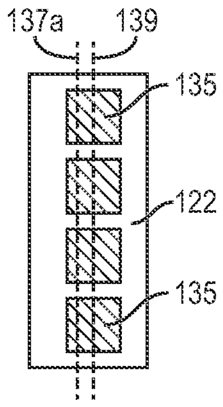
FIGS. 5*a*-5*e* illustrate singulation of rectangular conductive vias with cutting variance.
Figure 5B:
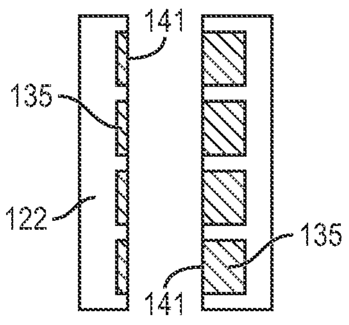
Figure 5C:
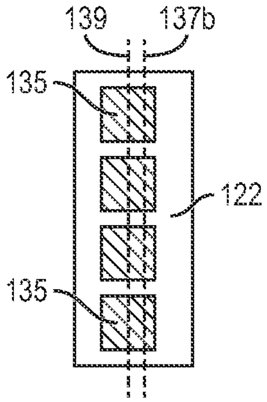
Figure 5D:
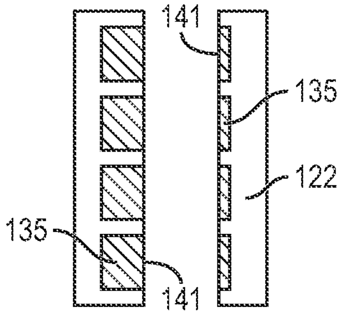
Figure 5E:
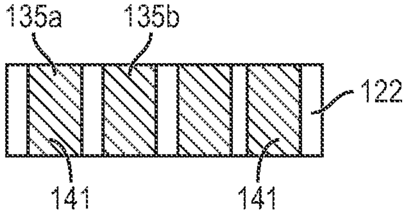

FIGS. 5*a*-5*e* illustrate further detail of singulation through rectangular conductive vias 135 arranged in the repeating side-by-side pattern around die attachment area 138*a*-138*d*. In FIG. 5*a*, dicing line 137*a* is to the left of an ideal centerline 139 through conductive vias 135, due to the cutting variance. FIG. 5*b* shows the post singulation along dicing line 137*a*. In FIG. 5*c*, dicing line 137*b* is to the right of an ideal centerline 139 through conductive vias 135, again due to the cutting variance. FIG. 5*d* shows the post singulation along dicing line 137*a*. The repeating side-by-side pattern of rectangular conductive vias 135 provides enhanced contact surface area along vertical side surface 141 post singulation, given variance during cutting along dicing lines 137*a*-137*b*. In other words, the vertical side surface area 141 of rectangular conductive vias 135 is the same, independent of variance during cutting along dicing lines 137*a*-137*b*. FIG. 5*e* shows a side view of core substrate 122 and conductive vias 135 with vertical contact side surface 141 post singulation.

Figure 6A:
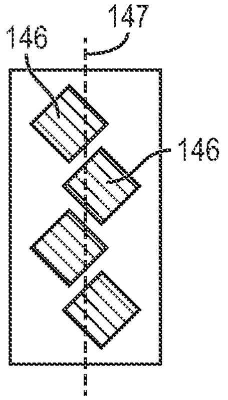
FIGS. 6*a*-6*b* illustrate singulation of rhombus conductive vias.
Figure 6B:
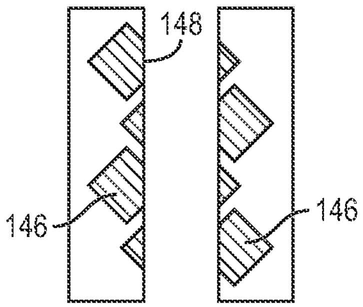

FIGS. 6*a*-6*b* illustrate further detail of singulation through rhombus-shaped conductive vias 146 arranged in the staggered or offset pattern around die attachment areas 138*a*-138*d*. In FIG. 6*a*, conductive vias 146 are cut along dicing line 147. FIG. 6*b* shows the post singulation along dicing line 147. The staggered or offset pattern of conductive vias 146 provides enhanced contact surface area along vertical side surface 148 to shielding layer 160, given variance during cutting along dicing line 147. In fact, the total contact area between vertical side surfaces 148 and shielding layer 160 remains substantially uniform and constant. The enhanced contact surface area along vertical side surface 148 improves adhesion between conductive vias 146 and shielding layer 160, as well as effectiveness of electrical properties of the shielding layer.

Figure 7A:
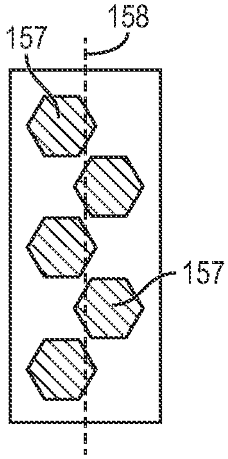
FIGS. 7*a*-7*b* illustrate singulation of hexagon conductive vias.
Figure 7B:
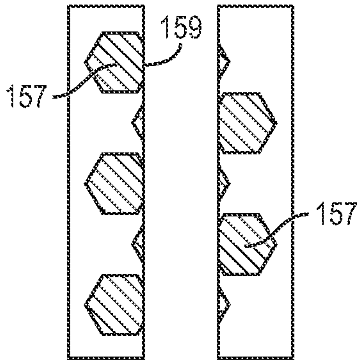

FIGS. 7*a*-7*b* illustrate further detail of singulation through hexagon-shaped conductive vias 157 arranged in the staggered or offset pattern around die attachment areas 138*a*-138*d*. In FIG. 7*a*, conductive vias 157 are cut along dicing line 158. FIG. 7*b* shows the post singulation along dicing line 158. The staggered or offset pattern of conductive vias 157 provides enhanced contact surface area along vertical side surface 159 to shielding layer 160, given variance during cutting along dicing line 158. In fact, the total contact area between vertical side surfaces 159 and shielding layer 160 remains substantially uniform and constant. The enhanced contact surface area along vertical side surface 159 improves adhesion between conductive vias 157 and shielding layer 160, as well as effectiveness of electrical properties of the shielding layer.

The rhombus shaped conductive vias 146 and hexagon shaped conductive vias 157 in FIGS. 6-7 can reduce damage during mechanical sawing. Mechanical sawing is stable and low cost method for singulation. However, the mechanical saw causes shear stress into the rigid material, particularly metal such as via or conductive layer. The shear stress can result in delamination or other failure. The rhombus or hexagon pattern has less curvature than a circle and reduces shear stress.

Semiconductor die 104 may contain IPDs that are susceptible to or generate EMI, RFI, harmonic distortion, and inter-device interference. For example, the IPDs contained within semiconductor die 104 provide the electrical characteristics needed for high-frequency applications, such as resonators, high-pass filters, low-pass filters, band-pass filters, symmetric Hi-Q resonant transformers, and tuning capacitors. In another embodiment, semiconductor die 104 contains digital circuits switching at a high frequency, which could interfere with the operation of IPDs in nearby semiconductor packages.

Figure 8:
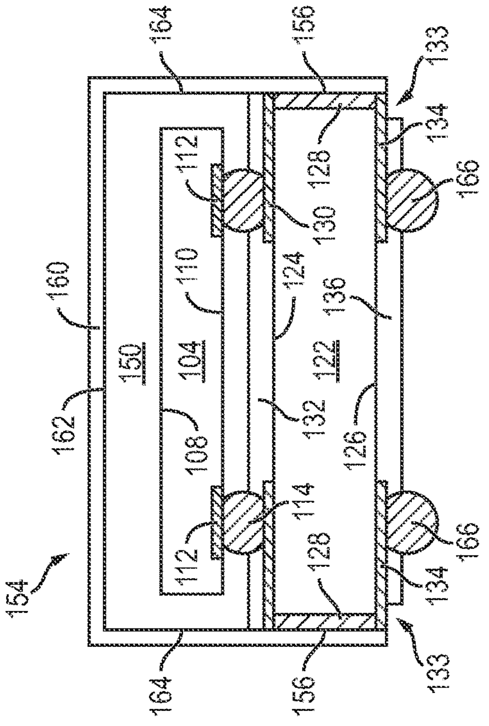
FIG. 8 illustrates the semiconductor package according to FIGS. 3*a*-3*e* with a shielding layer connected to a side surface of the staggered conductive vias.

In FIG. 8, shielding layer 160 is formed over surfaces 162 and 164 of encapsulant 150, using for example a sputtering process. Shielding layer 160 can be one or more layers of Al, Cu, Sn, Ni, Au, Ag, or other suitable conductive material. Alternatively, shielding layer 160 can be carbonyl iron, stainless steel, nickel silver, low-carbon steel, silicon-iron steel, foil, conductive resin, carbon-black, aluminum flake, and other metals and composites capable of reducing the effects of EMI, RFI, and other inter-device interference.

The staggered or offset pattern of conductive vias 128 provides enhanced contact surface area along vertical side surface 156 to shielding layer 160, given variance during cutting along dicing lines 140 and 142. In fact, the total contact area between vertical side surfaces 156 and shielding layer 160 remains substantially uniform and constant, independent of singulation location within a tolerance of centerline 144. The enhanced contact surface area along vertical side surface 156 improves adhesion between conductive vias 128 and shielding layer 160, as well as effectiveness of electrical properties of the shielding layer. With the cylindrical form-factor and offset or staggered pattern, some conductive vias 128 have more exposed side surface area, some conductive vias 128 have less exposed side surface area. The total exposed side surface area 156 among multiple conductive vias 128 remains unchanged, independent of the dicing location within a tolerance of centerline 144. The shapes of conductive vias 135, 146, or 157 can also be used to attach shielding layer 160.

An electrically conductive bump material is deposited over conductive layer 134 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 134 using a suitable attachment or bonding process. In one embodiment, the bump material is reflowed by heating the material above its melting point to form balls or bumps 166. In one embodiment, bump 166 is formed over a UBM having a wetting layer, barrier layer, and adhesive layer. Bump 166 can also be compression bonded or thermocompression bonded to conductive layer 134. Bump 166 represents one type of interconnect structure that can be formed over conductive layer 134. The interconnect structure can also use bond wires, conductive paste, stud bump, micro bump, or other electrical interconnect.

Shielding layer 160 makes contact to an external ground through conductive vias 128 and conductive layer 134 in area 133. Alternatively, shielding layer 160 can make contact to an external ground through conductive vias 128, conductive layer 134, and bumps 166. Semiconductor die 104 makes functional signal contact with external components through conductive layer 130, conductive vias 128, conductive layer 134, and bumps 166.

Figure 9B:
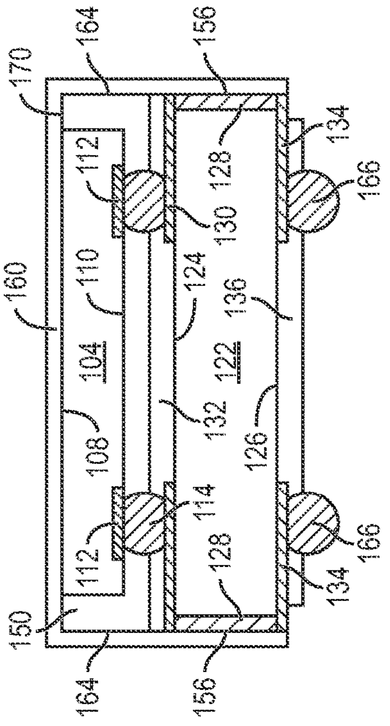
FIGS. 9*a*-9*b* illustrate another process of forming the semiconductor package with a shielding layer.
Figure 9A:
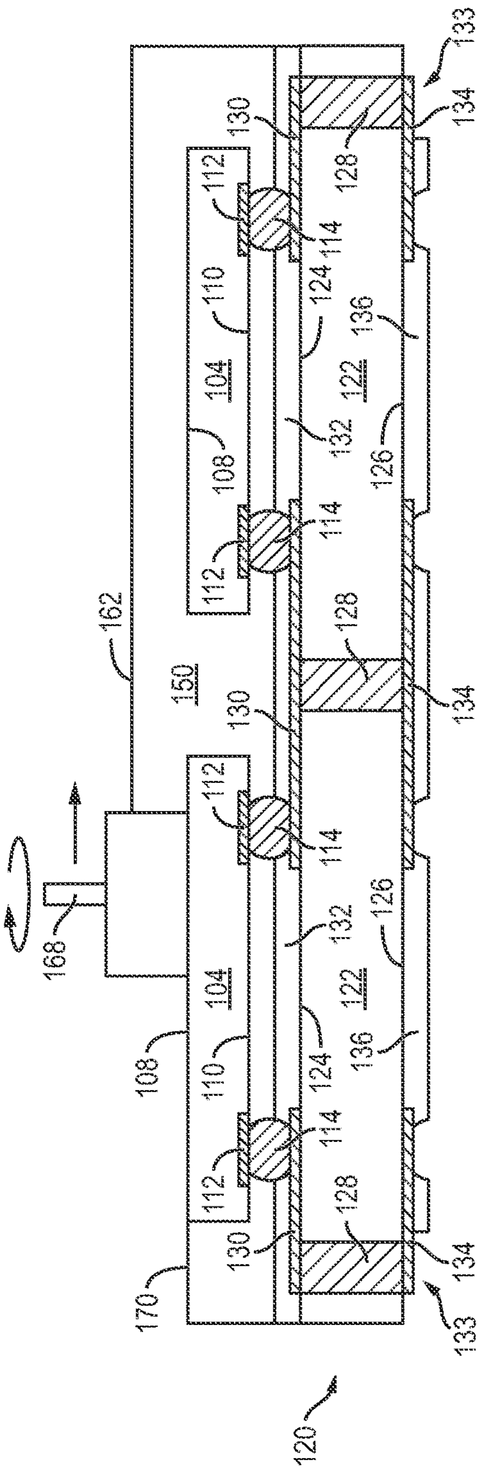

FIG. 9*a* shows a portion of encapsulant 150 removed by grinder 168 to expose back surface 108 of semiconductor die 104. Grinder 168 further planarizes surface 170 of encapsulant 150. Alternatively, a portion of encapsulant 150 is removed by an etching process or LDA to planarize surfaces 170 and expose back surface 108 of semiconductor die 104. In FIG. 9*b*, shielding layer 160 is formed over surfaces 170 and 164 of encapsulant 150 and back surface 108 of semiconductor die 104. Bump 166 is formed over conductive layer 134, as described above.

Figure 10A:
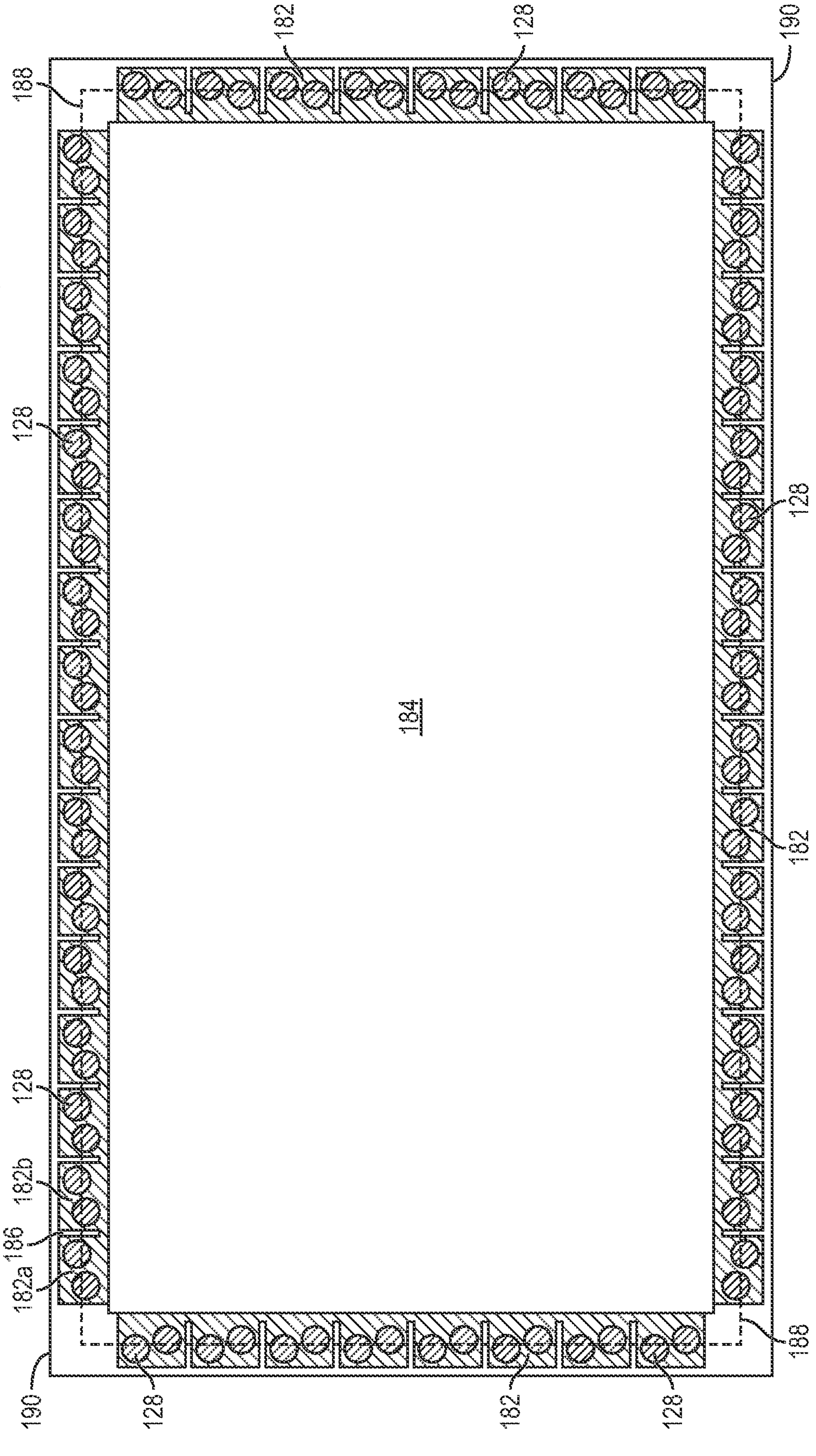
FIGS. 10*a*-10*d* illustrate a process of forming a semiconductor package using the substrate panel with a repeating pattern of gear-tooth shaped conductive layer.

In another embodiment, substrate panel 180 includes conductive layer 182 formed on a bottom surface of substrate 180 and arranged in a repeating "gear-teeth" pattern completely around die attachment area 184, as shown in FIG. 10*a*. Die attach area 184 is a bump attach area with solder resist covering and designated for placement of at least one semiconductor die 104. Conductive layer 182*a* represents one tooth of the gear, conductive layer 182*b* represents another tooth. One side of conductive layer 182 is continuous along the sides of die attachment area 184. Each tooth of the pattern, e.g. conductive layer 182*a*, conductive layer 182*b*, is separated by gap 186. Gaps 186 are regularly spaced between portions of conductive layer 182 to form the gear teeth. One or more conductive vias 128, 135, 146, or 157 can optionally be formed through substrate panel 180 under each portion of conductive layer 182. For example, two conductive vias 128 are formed through substrate panel 180 under conductive layer 182*a*, and two conductive vias 128 are formed through substrate panel 180 under conductive layer 182*b*. Substrate panel 180 will be singulated through dicing lines 188. The repeating gear-tooth pattern of conductive layer 182, with optional conductive vias 128, provides enhanced contact surface area along the vertical side surface post singulation.

Figure 10B:
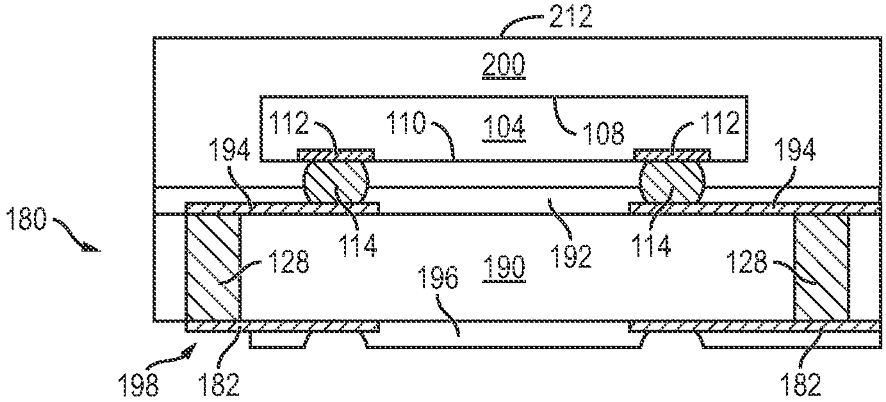

In FIG. 10*b*, semiconductor die 104 from FIG. 1*c* are positioned over die attach area 184 of substrate panel 180 using a pick and place operation, similar to FIGS. 3*a*-3*b*. An encapsulant or molding compound 200 is deposited over semiconductor die 104 and substrate panel 180, similar to FIG. 3*d*. Conductive layer 182 and conductive vias 128 extend through core substrate 190, similar to FIG. 2*a*. A conductive layer 194 is formed over a surface of core substrate 190 opposite conductive layer 182. Conductive layer 194 may have the same "gear-tooth" pattern as conductive layer 182. An insulating or passivation layer 192 is formed over core substrate 190 and conductive layer 194. An insulating or passivation layer 196 is formed over core substrate 190 and conductive layer 182. A portion of insulating layers 192 and 196 is removed by LDA, etching, or other suitable process to expose portions of conductive layers 182 and 194, as well as areas 198 proximate to the connection between conductive layer 182 and conductive vias 128. Areas 198 with no insulating layer 196 extend around a perimeter of substrate panel 180 to provide external ground connection.

Figure 10C:
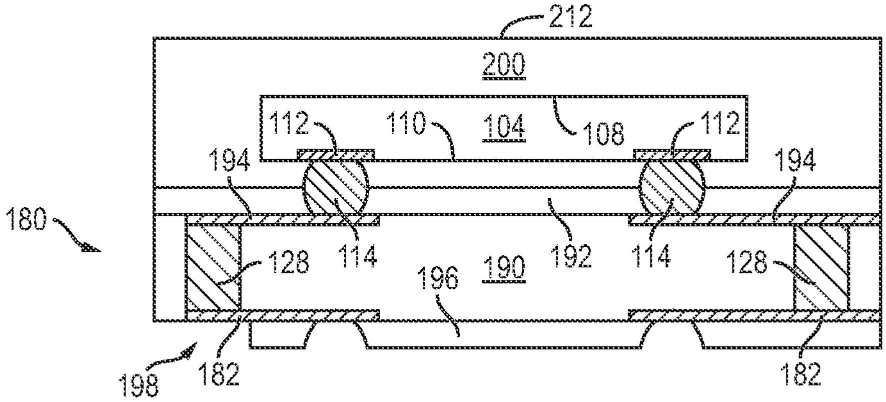

FIG. 10*c* shows an alternate embodiment with conductive layers 182 and 194 embedded within core substrate 190.

Figure 10D:
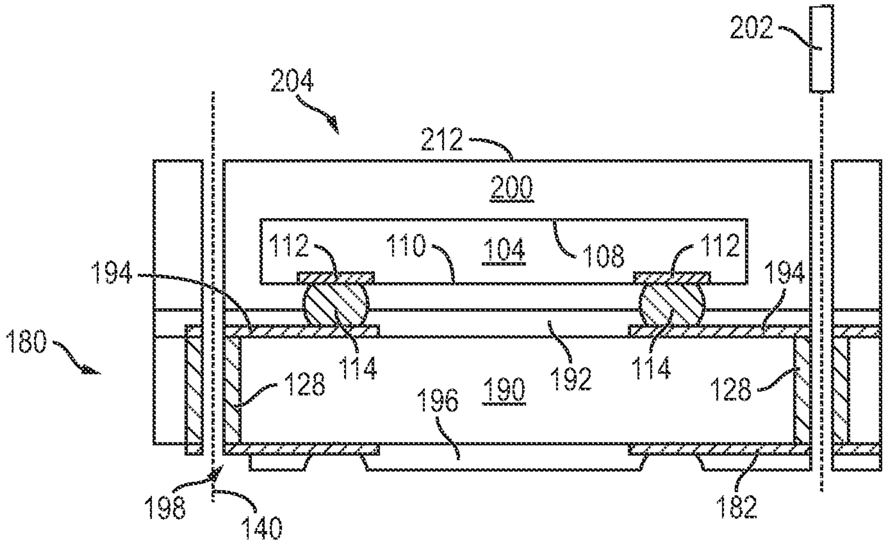

In FIG. 10*d*, semiconductor panel 180 is singulated through conductive layer 182 and conductive vias 128 along dicing lines 188, see FIG. 10*a*, using a saw blade or laser cutting tool 202 into individual semiconductor packages 204. The singulation process has variance and tolerances of the cutting path. The repeating gear-tooth pattern of conductive layer 182, with optional conductive vias 128, provides enhanced contact surface area along vertical side surface 156 post singulation. Core substrate 190 is subject to metal burring during singulation. Metal burr can attach to circuits causing electrical short failure. The gear pattern of conductive layer 182 reduces metal burring effects during singulation. Conductive layer 182 can be a thin layer although rigid relative to core substrate 190.

Figure 11:
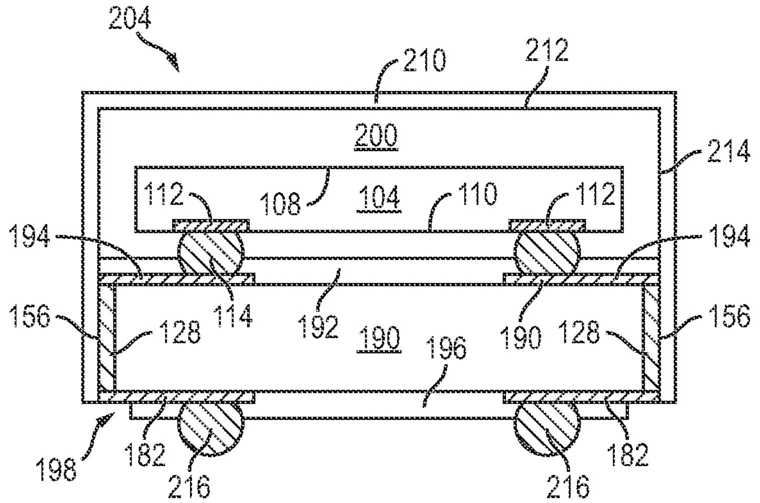
FIG. 11 illustrates the semiconductor package according to FIGS. 10*a*-10*c* with a shielding layer connected to a side surface of the rectangular conductive vias.

In FIG. 11, shielding layer 210 is formed over surfaces 212 and 214 of encapsulant 200, using for example a sputtering process. Shielding layer 210 can be one or more layers of Al, Cu, Sn, Ni, Au, Ag, or other suitable conductive material. Alternatively, shielding layer 210 can be carbonyl iron, stainless steel, nickel silver, low-carbon steel, silicon-iron steel, foil, conductive resin, carbon-black, aluminum flake, and other metals and composites capable of reducing the effects of EMI, RFI, and other inter-device interference. Bumps 216 are formed over conductive layer 182. Shielding layer 210 can also be formed in contact with back surface 108 of semiconductor die 104, as described in FIGS. 9*a*-9*b*.

The repeating pattern of conductive layer 182 and conductive vias 128 provides enhanced contact surface area along vertical side surface 156 to shielding layer 210, given variance during cutting along dicing lines 188. In fact, the total contact area between vertical side surfaces 156 and shielding layer 210 remains substantially uniform and constant, independent of singulation location. The enhanced contact surface area along vertical side surface 156 improves adhesion between conductive layer 182 and conductive vias 128 and shielding layer 210, as well as effectiveness of the shielding layer.

Shielding layer 210 makes contact to an external ground through conductive layer 182 and conductive vias 128 and conductive layer 182 in areas 198. Alternatively, shielding layer 210 can make contact to an external ground through conductive layer 182, conductive vias 128, conductive layer 194, and bumps 216. Semiconductor die 104 makes functional signal contact with external components through conductive layer 182, conductive vias 128, conductive layer 194, and bumps 216.

Figure 12:
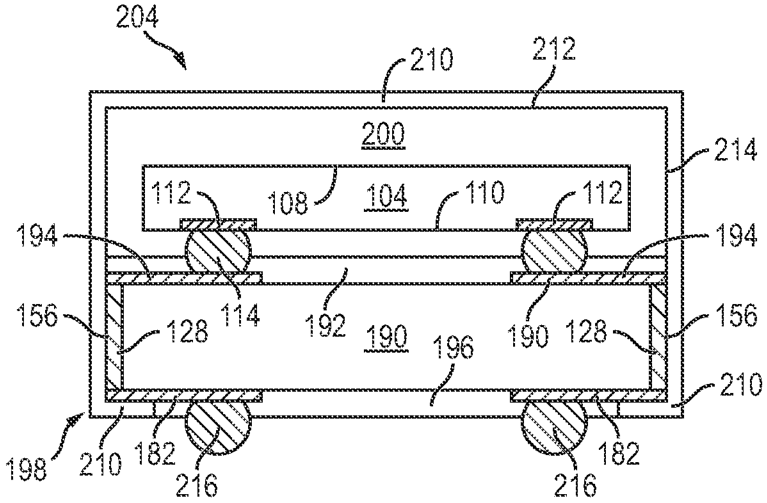
FIG. 12 illustrates the semiconductor package with the shielding layer extending over a bottom conductive layer.

In FIG. 12, shielding layer 210 is formed over surfaces 212 and 214 of encapsulant 200, similar to FIG. 11, and extends over conductive layer 196 in area 198 and into the openings in insulating layer 136. Conductive layer 182 is electrically connected to shielding layer 210.

Figure 13:
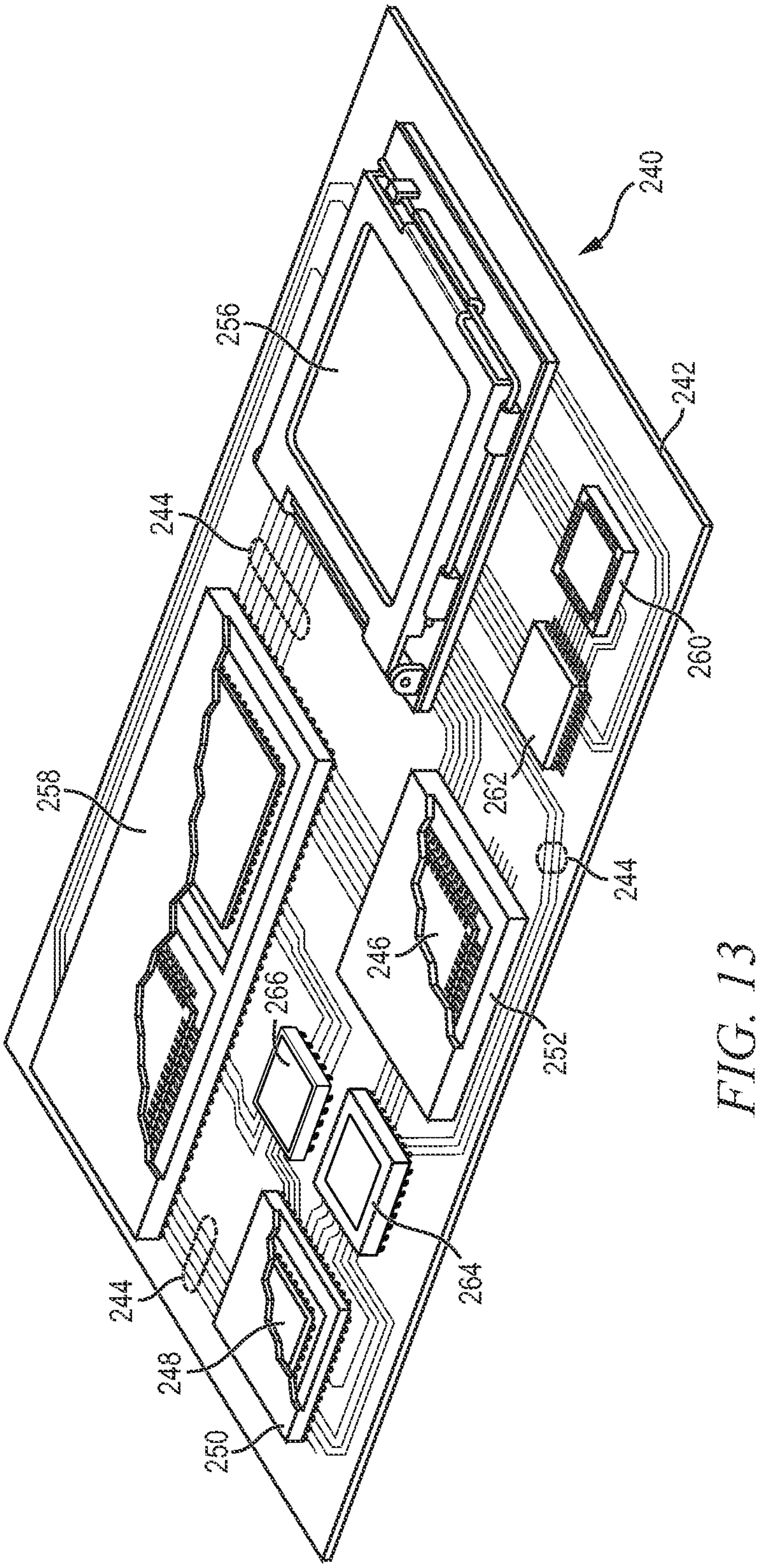
FIG. 13 illustrates a printed circuit board (PCB) with different types of packages mounted to a surface of the PCB.

FIG. 13 illustrates electronic device 240 having a chip carrier substrate or PCB 242 with a plurality of semiconductor packages mounted on a surface of PCB 242, including semiconductor package 154 or 204. Electronic device 240 can have one type of semiconductor package, or multiple types of semiconductor packages, depending on the application.

Electronic device 240 can be a stand-alone system that uses the semiconductor packages to perform one or more electrical functions. Alternatively, electronic device 240 can be a subcomponent of a larger system. For example, electronic device 240 can be part of a tablet, cellular phone, digital camera, communication system, or other electronic device. Alternatively, electronic device 240 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 13, PCB 242 provides a general substrate for structural support and electrical interconnect of the semiconductor packages mounted on the PCB. Conductive signal traces 244 are formed over a surface or within layers of PCB 242 using evaporation, electrolytic plating, electroless plating, screen printing, or other suitable metal deposition process. Signal traces 244 provide for electrical communication between each of the semiconductor packages, mounted components, and other external system components. Traces 244 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 246 and flipchip 248, are shown on PCB 242. Additionally, several types of second level packaging, including ball grid array (BGA) 250, bump chip carrier (BCC) 252, land grid array (LGA) 256, multi-chip module (MCM) 258, quad flat non-leaded package (QFN) 260, quad flat package 262, embedded wafer level ball grid array (eWLB) 264, and wafer level chip scale package (WLCSP) 266 are shown mounted on PCB 242. In one embodiment, eWLB 264 is a fan-out wafer level package (Fo-WLP) and WLCSP 266 is a fan-in wafer level package (Fi-WLP). Depending upon the system requirements, any combination of semiconductor packages, configured with any combination of first and second level packaging styles, as well as other electronic components, can be connected to PCB 242. In some embodiments, electronic device 240 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
- providing a substrate;
- forming a conductive layer over and around the substrate;
- forming a plurality of conductive vias through the substrate, wherein a first conductive via of the plurality of conductive vias is adjacent to and offset with respect to a second conductive via of the plurality of conductive vias;
- providing a first gap extending partially but not completely through the conductive layer between the first conductive via and second conductive via to form a gear structure of the conductive layer;
- disposing an electrical component in a die attach area over a first surface of the substrate; and
- singulating the substrate through the first conductive via and second conductive via.

2. The method of claim 1, further including:
- providing a third conductive via of the plurality of conductive vias adjacent to and offset with respect to a fourth conductive via of the plurality of conductive vias and further adjacent to and offset with respect to the second conductive via; and
- providing a second gap extending through the conductive layer between the third conductive via and fourth conductive via.

3. The method of claim 2, wherein a portion of the conductive layer between the first gap and second gap forms a tooth in the gear structure.

4. The method of claim 1, further including disposing a shielding layer over the electrical component.

5. The method of claim 1, further including depositing an encapsulant over the substrate and electrical component.

6. The method of claim 1, wherein a side surface of the first conductive via has a greater exposed surface area than a side surface of the second conductive via.

7. A method of making a semiconductor device, comprising:
- providing a substrate;
- forming a conductive layer over and around the substrate;
- forming a plurality of conductive vias through the substrate, wherein a first conductive via of the plurality of conductive vias is adjacent to and offset with respect to a second conductive via of the plurality of conductive vias; and
- providing a first gap extending partially but not completely through the conductive layer between the first conductive via and second conductive via.

8. The method of claim 7, further including:
- providing a third conductive via of the plurality of conductive vias adjacent to and offset with respect to a fourth conductive via of the plurality of conductive vias and further adjacent to and offset with respect to the second conductive via; and
- providing a second gap extending through the conductive layer between the third conductive via and fourth conductive via.

9. The method of claim 8, wherein a portion of the conductive layer between the first gap and second gap forms a tooth in a gear structure.

10. The method of claim 7, further including:
- disposing an electrical component in a die attach area over a first surface of the substrate; and
- disposing a shielding layer over the electrical component.

11. The method of claim 10, further including depositing an encapsulant over the substrate and electrical component.

12. The method of claim 7, further including singulating the substrate through the first conductive via and second conductive via.

13. The method of claim 7, wherein a side surface of the first conductive via has a greater exposed surface area than a side surface of the second conductive via.

14. A semiconductor device, comprising:
- a substrate;
- a conductive layer formed over and around the substrate;
- a plurality of conductive vias formed through the substrate, wherein a first conductive via of the plurality of conductive vias is adjacent to and offset with respect to a second conductive via of the plurality of conductive vias;
- a first gap extending partially but not completely through the conductive layer between the first conductive via and second conductive via to form a gear structure of the conductive layer; and
- an electrical component disposed in a die attach area over a first surface of the substrate.

15. The semiconductor device of claim 14, further including:
- a third conductive via of the plurality of conductive vias adjacent to and offset with respect to a fourth conductive via of the plurality of conductive vias and further adjacent to and offset with respect to the second conductive via; and
- a second gap extending through the conductive layer between the third conductive via and fourth conductive via.

16. The semiconductor device of claim 15, wherein a portion of the conductive layer between the first gap and second gap forms a tooth in the gear structure.

17. The semiconductor device of claim 14, further including a shielding layer disposed over the electrical component.

18. The semiconductor device of claim 14, further including an encapsulant deposited over the substrate and electrical component.

19. The semiconductor device of claim 14, wherein a side surface of the first conductive via has a greater exposed surface area than a side surface of the second conductive via.

20. A semiconductor device, comprising:
- a substrate;
- a conductive layer formed over and around the substrate;
- a plurality of conductive vias formed through the substrate, wherein a first conductive via of the plurality of conductive vias is adjacent to and offset with respect to a second conductive via of the plurality of conductive vias; and a first gap extending partially but not completely through the conductive layer between the first conductive via and second conductive via to form a gear structure of the conductive layer.

21. The semiconductor device of claim 20, further including:

a third conductive via of the plurality of conductive vias adjacent to and offset with respect to a fourth conductive via of the plurality of conductive vias and further adjacent to and offset with respect to the second conductive via; and a second gap extending through the conductive layer between the third conductive via and fourth conductive via.

22. The semiconductor device of claim 21, wherein a portion of the conductive layer between the first gap and second gap forms a tooth in the gear structure.

23. The semiconductor device of claim 20, further including:

an electrical component disposed in a die attach area over a first surface of the substrate; and a shielding layer disposed over the electrical component.

24. The semiconductor device of claim 23, further including an encapsulant deposited over the substrate and electrical component.

25. The semiconductor device of claim 20, wherein a side surface of the first conductive via has a greater exposed surface area than a side surface of the second conductive via.

26. A semiconductor device, comprising:

a substrate;

a conductive layer formed over and around the substrate; and a plurality of conductive vias formed through the substrate with a first gap extending partially but not completely through the conductive layer between a first conductive via of the plurality of conductive vias and a second conductive via of the plurality of conductive vias.

27. The semiconductor device of claim 26, further including a second gap extending through the conductive layer between a third conductive via of the plurality of conductive vias and a fourth conductive via of the plurality of conductive vias.

28. The semiconductor device of claim 27, wherein a portion of the conductive layer between the first gap and second gap forms a tooth in a gear structure.

29. The semiconductor device of claim 26, further including:

an electrical component disposed in a die attach area over a first surface of the substrate; and a shielding layer disposed over the electrical component.

30. The semiconductor device of claim 29, further including an encapsulant deposited over the substrate and electrical component.

31. The semiconductor device of claim 26, wherein a side surface of the first conductive via has a greater exposed surface area than a side surface of the second conductive via.

* * * * *